United States Patent
Peng et al.

(10) Patent No.: US 12,512,870 B2
(45) Date of Patent: Dec. 30, 2025

(54) ORTHOGONAL SIGNAL GENERATOR AND METHOD THEREOF, PHASE SHIFTER AND METHOD THEREOF, AND AMPLIFYING DEVICE

(71) Applicant: SMARTER MICROELECTRONICS (GUANG ZHOU) CO., LTD., Guangzhou (CN)

(72) Inventors: Yangyang Peng, Guangzhou (CN); Ping Li, Guangzhou (CN); Yang Li, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 320 days.

(21) Appl. No.: 18/479,105

(22) Filed: Oct. 1, 2023

(65) Prior Publication Data
US 2024/0030958 A1 Jan. 25, 2024

Related U.S. Application Data

(63) Continuation of application No. PCT/CN2022/121854, filed on Sep. 27, 2022.

(30) Foreign Application Priority Data

Sep. 27, 2021 (CN) .......................... 202111133966.9

(51) Int. Cl.
*H04B 1/40* (2015.01)
*H03D 7/16* (2006.01)
*H03H 11/20* (2006.01)

(52) U.S. Cl.
CPC ............... *H04B 1/40* (2013.01); *H03D 7/165* (2013.01); *H03H 11/20* (2013.01)

(58) Field of Classification Search
CPC .......... H04B 1/40; H03D 7/165; H03H 11/20; H03H 7/21; H03H 11/16
See application file for complete search history.

(56) References Cited

U.S. PATENT DOCUMENTS

| | | | |
|---|---|---|---|
| 5,650,714 A * | 7/1997 | Otaka | H03H 11/22 323/217 |
| 2019/0181907 A1* | 6/2019 | Pfann | H03H 9/52 |
| 2020/0186126 A1* | 6/2020 | Miyazaki | H03H 9/25 |
| 2020/0266538 A1* | 8/2020 | Okada | H03D 7/1466 |
| 2022/0303106 A1* | 9/2022 | Li | H01Q 3/30 |

* cited by examiner

*Primary Examiner* — Kenneth T Lam
(74) *Attorney, Agent, or Firm* — Syncoda LLC; Feng Ma (57) ABSTRACT

An orthogonal signal generator includes a first stage phase shifting circuit and a second stage phase shifting circuit. The output end of the first stage phase shifting circuit is connected with the input end of the second stage phase shifting circuit, an impedance of the first stage phase shifting circuit is adjustable based on the frequency of a first input signal. The first stage phase shifting circuit is configured to phase-shift the first input signal by a first phase shifting angle to generate a first phase shifting angle signal. An impedance of the second stage phase shifting circuit is adjustable based on a frequency of a second input signal. The second stage phase shifting circuit is configured to phase-shift the phase-shifted second input signal by a second phase shifting angle to output an orthogonal signal with the corresponding frequency.

11 Claims, 10 Drawing Sheets

ORTHOGONAL SIGNAL GENERATOR AND METHOD THEREOF, PHASE SHIFTER AND METHOD THEREOF, AND AMPLIFYING DEVICE

CROSS-REFERENCE TO RELATED APPLICATIONS

This is a continuation of International Application No. PCT/CN2022/121854 filed on Sep. 27, 2022, which claims priority to Chinese Patent Application No. 202111133966.9 filed on Sep. 27, 2021. The disclosures of the above-referenced applications are hereby incorporated by reference in their entirety.

BACKGROUND

In some implementations, the bandwidth of an orthogonal signal generator in the phase shifter is not wide enough to generate orthogonal signal under the wide bandwidth, which limits the bandwidth of the whole phase shifter.

SUMMARY

The disclosure relates to, but is not limited to, an orthogonal signal generator and a method thereof, a phase shifter and a method thereof, and an amplifying device.

In view of this, embodiments of the disclosure provide an orthogonal signal generator and a method thereof, a phase shifter and a method thereof, and an amplifying device.

In the first aspect, the embodiments of the disclosure provide an orthogonal signal generator, which includes a first stage phase shifting circuit and a second stage phase shifting circuit.

An output end of the first stage phase shifting circuit is connected with an input end of the second stage phase shifting circuit; an impedance of the first stage phase shifting circuit is adjustable based on a frequency of a first input signal; the first stage phase shifting circuit is configured to phase-shift the first input signal by a first phase shifting angle and generate a first phase shifting angle signal.

An impedance of the second stage phase shifting circuit is adjustable based on a frequency of a second input signal; the second stage phase shifting circuit is configured to phase-shift the phase-shifted second input signal by a second phase shifting angle and output an orthogonal signal with a corresponding frequency.

In an embodiment, a sum of the second phase shifting angle and the first phase shifting angle is equal to 90 degrees.

In an embodiment, the first stage phase shifting circuit includes a first resistor sub-circuit and a first capacitor sub-circuit; and/or the second stage phase shifting circuit includes a second resistor sub-circuit and a second capacitor sub-circuit.

The first stage phase shifting circuit is configured to adjust an equivalent capacitance of the first capacitor sub-circuit and/or an equivalent resistance of the first resistor sub-circuit based on the frequency of the first input signal.

The second stage phase shifting circuit is configured to adjust an equivalent capacitance of the second capacitor sub-circuit and/or an equivalent resistance of the second resistor sub-circuit based on the frequency of the second input signal.

In an embodiment, the first resistor sub-circuit and/or the first capacitor sub-circuit includes a first impedance adjusting circuit having a plurality of first switches and performing impedance adjustment through the first switches; and/or the second resistor sub-circuit and/or the second capacitor sub-circuit includes a second impedance adjusting circuit having a plurality of second switches and performing impedance adjustment through the second switches.

In an embodiment, the first stage phase shifting circuit is configured to generate the first phase shifting angle signal based on a first delay constant which is a product of the equivalent capacitance of the first capacitor sub-circuit and the equivalent resistance of the first resistor sub-circuit; and/or the second stage phase shifting circuit is configured to generate the orthogonal signal with a corresponding frequency based on a second delay constant which is a product of the equivalent capacitance of the second capacitor sub-circuit and the equivalent resistance of the second resistor sub-circuit.

In an embodiment, the orthogonal signal generator includes a multi-stage phase shifting circuit, and the sum of phase shifting angles of all stages of the multi-stage phase shifting circuit is equal to 90 degrees.

In an embodiment, the phase shifting angles of all stages are the same, or the phase shifting angles of all stages are partially the same, or the phase shifting angles of all stages are different from each other.

In an embodiment, an input signal of the orthogonal signal generator is a differential signal.

In the second aspect, the embodiments of the disclosure provide a phase shifter which includes an adder, a controller and an orthogonal signal generator according to any one of the above.

An output end of the controller is respectively connected with an input end of the orthogonal signal generator and a first input end of the adder, and the controller is configured to generate a first control signal based on a frequency of an input radio frequency signal and to generate a second control signal based on a target phase shifting angle. The first control signal is used for controlling the orthogonal signal generator, and the second control signal is used for controlling the adder.

An output end of the orthogonal signal generator is connected with a second input end of the adder, and the orthogonal signal generator is configured to generate an orthogonal signal with a corresponding frequency based on the first control signal.

In the third aspect, the embodiments of the disclosure provide an amplifying device, which includes an amplification circuit and a phase shifter described above. The phase shifter includes an adder, a controller, and an orthogonal signal generator.

Herein, an output end of the phase shifter is connected with an input end of the amplification circuit.

In the fourth aspect, a method for generating an orthogonal signal which is applied to the orthogonal signal generator according to any one of the above is provided. The method includes the following operations.

The first stage phase shifting circuit adjusts its own circuit impedance based on the frequency of the first input signal, and phase-shift the first input signal by the first phase shifting angle to output the first phase shifting angle signal.

The second stage phase shifting circuit adjusts its own circuit impedance based on the frequency of the second input signal, and phase-shift the phase-shifted second input signal by the second phase shifting angle to output the orthogonal signal with the corresponding frequency.

In the fifth aspect, a method for phase shifting, which applied to the phase shifter described above is provided. The method includes the following operations.

The frequency of the input radio frequency signal is acquired in real time.

The first control signal is generated based on the frequency of the input radio frequency signal and is used for controlling the orthogonal signal generator.

A preset phase shifting angle is acquired.

The second control signal is generated based on the preset phase shifting angle and is used for controlling the adder.

The orthogonal signal generator is controlled based on the first control signal, to generate the orthogonal signal with the corresponding frequency.

The adder is controlled based on the second control signal to vector-synthesize the orthogonal signal to output a first in-phase orthogonal signal.

In an embodiment, the orthogonal signal generator includes a first stage phase shifting circuit and a second stage phase shifting circuit.

The first control signal includes a first input signal used for controlling the first stage phase shifting circuit and a second type of sub-control signal used for controlling the second stage phase shifting circuit. The generation of the first control signal based on the frequency of the input radio frequency signal includes the following operations.

A product of a frequency of the input radio frequency signal and a phase shifting angle of the first stage phase shifting circuit is determined as a first product.

A first delay constant of the first stage phase shifting circuit is determined based on the first product.

The first input signal is generated based on the first delay constant.

A product of the frequency of the input radio frequency signal and a phase shifting angle of the second stage phase shifting circuit is determined as a second product.

A second delay constant of the second stage phase shifting circuit is determined based on the second product.

The second type of sub-control signal is generated based on the second delay constant.

Correspondingly, the control of the orthogonal signal generator based on the first control signal to generate the orthogonal signal with the corresponding frequency includes the following operations.

The first stage phase shifting circuit is controlled, based on the first input signal, to output a first phase shifting angle signal.

The second stage phase shifting circuit is controlled, based on the second type of sub-control signal, to output an orthogonal signal with the corresponding frequency.

In the embodiments of the disclosure, the orthogonal signal generator can adjust impedance based on the frequency of the input signal, so that the phase shifter with the above orthogonal signal generator has different impedances when phase-shifting the input signals with different frequencies, which allows the orthogonal signal generator to have a larger bandwidth, thereby increasing the bandwidth of the whole phase shifter.

It should be understood that the above general description and the following detailed description are exemplary and explanatory only and are not limiting to the disclosure.

BRIEF DESCRIPTION OF THE DRAWINGS

The drawings, which are incorporated in and constitute a part of the specification, illustrate embodiments consistent with the disclosure and together with the description serve to explain the technical solution of the disclosure.

DETAILED DESCRIPTION

The disclosure will be further described in detail below with reference to the drawings and embodiments. It should be understood that the embodiments provided herein are intended to be explanatory only and are not intended to limit the disclosure. In addition, the embodiments provided below are a part of embodiments for implementing the disclosure, not all of the embodiments. The technical solutions described in the embodiments of the disclosure can be implemented in any combination without conflict.

It should be noted that, in the embodiments of the disclosure, terms "include", "comprise" or any other variation thereof are intended to encompass non-exclusive inclusion, so that a method or equipment that includes a set of elements includes not only those explicitly recorded elements but also other elements that are not explicitly listed, or also elements inherent to implementation of a method or an equipment. In the absence of further limitations, an element defined by the phrase "includes a . . . " does not preclude the existence of another relevant element (for example, an operation in the method, or a unit in equipment, such as part of the circuit, part of processor and part of program or software) in the method or equipment in which it is included.

The term "and/or" herein is merely used for describing an association relationship of associated objects, indicating that there can be three relationships. For example, for the expression "U and/or W", it may refer to three situations, i.e., U alone, both U and W, and W alone. In addition, the term "at least one" herein means any one or any combination of at least two of listed items. For example, for expressing "including at least one of U, W, V", it may refer to any one or more selected from the group consisting of U, W, and V.

Phase shifter is a device configured to generate multi-phase signals, which is widely used in radio frequency systems. The phase shifter can be mainly divided into active phase shifter and passive phase shifter. The active phase shifter is characterized by small area, flexibility and controllability, and in that it can generate gain, but its linearity is limited. The passive phase shifter is characterized by stable phase, high linearity, but large area and some loss.

Figure 1:
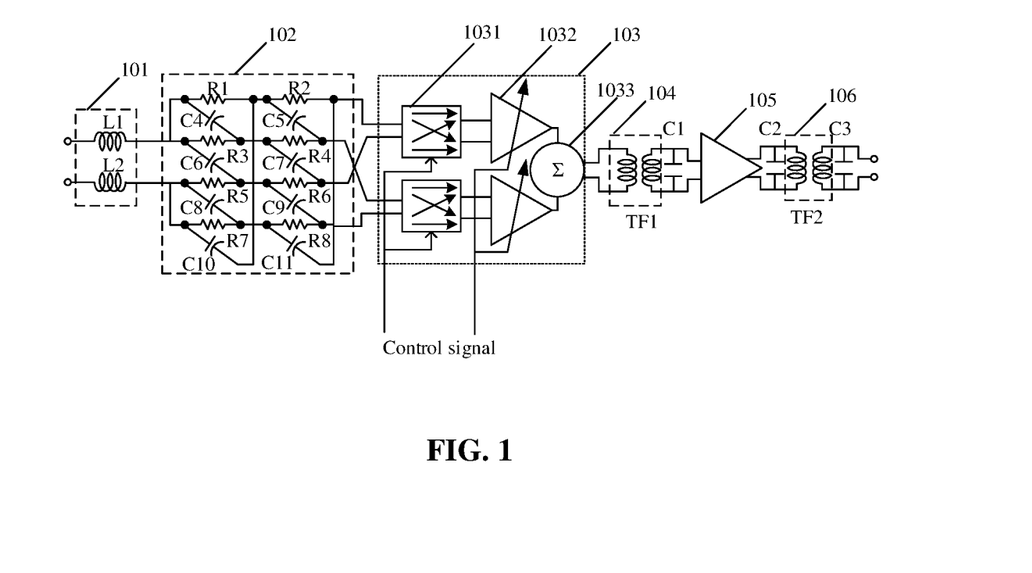
FIG. 1 is a component circuit diagram of an active phase shifter in some implementations.

FIG. 1 is a component circuit diagram of an active phase shifter in some implementations. As shown in FIG. 1, the active filter includes an inter stage matching network (IMN) 101, a poly phase filter (PPF) 102 and an analog adder 103 that are sequentially connected. Herein, a constant amplitude differential radio frequency signal is input to the input end of the IMN 101. The input constant amplitude differential radio frequency signal is network matched by the IMN 101, and the network matched constant amplitude differential radio frequency signal is input to the PPF 102. Four orthogonal signals (two positive output ends I+, Q+, and two negative output ends I−, Q−) with the same amplitude and 90-degree phase spacing are generated by the PPF102, and are input to the analog adder 103. The four orthogonal signals with the same amplitude and 90-degree phase spacing are vector-synthesized by the analog adder 103 in response to a control signal from the outside, and then a radio frequency signal with constant phase shift is output to the TF1 104. After isolation and first power conversion by TF1 104, a first power signal is output to the amplifier 105. The amplifier 105 performs second power conversion, and outputs a second power signal to the TF2 106. The TF2 106 performs isolation and third power conversion on the second power signal, and outputs the converted radio frequency signal with constant phase shift.

In some implementations, since the bandwidth of the orthogonal signal generator is limited, the orthogonal signal cannot be generated under a wider bandwidth, which limits the bandwidth of the whole phase shifter.

Figure 2:
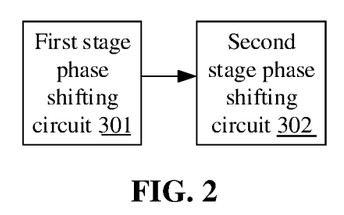
FIG. 2 is a schematic diagram of the component structure of an orthogonal signal generator provided by the embodiments of the disclosure.

On the basis of the above technical problems, the embodiments of the disclosure provide an orthogonal signal generator. As shown in FIG. 2, the orthogonal signal generator includes a first stage phase shifting circuit 301 and a second stage phase shifting circuit 302. The output end of the first stage phase shifting circuit 301 is connected with the input end of the second stage phase shifting circuit 302. The impedance of the first stage phase shifting circuit 301 is adjustable based on the frequency of a first input signal. The first stage phase shifting circuit 301 is configured to phase-shift the first input signal by a first phase shifting angle and to generate a first phase shifting angle signal. The impedance of the second stage phase shifting circuit 302 is adjustable based on the frequency of a second input signal. The second stage phase shifting circuit 302 is configured to phase-shift the second input signal phase-shifted by the first stage phase shifting circuit 301 by a second phase shifting angle and to output an orthogonal signal with a corresponding frequency.

Herein, both the first input signal and the second input signal may be radio frequency signals.

In the embodiments of the disclosure, the orthogonal signal generator can adjust the impedance based on the frequency of the input signal (the first input signal or the second input signal), so that the phase shifter with the above orthogonal signal generator has different impedances when phase-shifting the input signals with different frequencies, which allows the orthogonal signal generator to have a larger bandwidth, thereby increasing the bandwidth of the whole phase shifter.

In some possible embodiments, the input signal of the orthogonal signal generator is a differential signal.

In the embodiments of the disclosure, the input signal is a differential signal. In other embodiments, the input signal may be a single-ended signal, which becomes orthogonal through PPF without differential processing by the adder, and the orthogonal signal is directly amplified and then superimposed.

Figure 3:
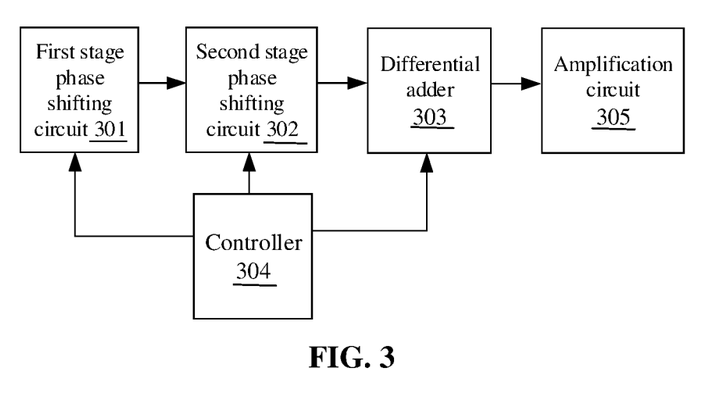
FIG. 3 is a schematic diagram of the component structure of a phase shifter provided by the embodiments of the disclosure.

The embodiments of the disclosure further provide a phase shifter. As shown in FIG. 3, the phase shifter includes an orthogonal signal generator and an adder connected in sequence. The adder is configured to vector-synthesize an orthogonal signal generated by the orthogonal signal generator.

With continued reference to FIG. 3, an embodiment further provides an amplifier assembly that includes a phase shifter and an amplification circuit connected in sequence. Herein, the amplification circuit is configured to amplify a powder of the input signal phase-shifted by the phase shifter.

With continued reference to FIG. 3, in some embodiments, the phase shifter also includes a controller. The controller 304 is connected with the orthogonal signal generator and the adder, and configured to generate a first control signal based on the frequency of an input radio frequency signal and to generate a second control signal based on the target phase shifting angle. The first control signal is used for controlling the orthogonal signal generator, while the second control signal is used for controlling the adder.

Specifically, the controller 304 is connected to the first stage phase shifting circuit 301 and the second stage phase shifting circuit 302, respectively, and configured to generate a first type of sub-control signal used for controlling the first stage phase-shifting circuit 301 and a second type of sub-control signal used for controlling the second stage phase-shifting circuit 302 based on the frequency of the input signal. That is, the first signal includes the first type of sub-control signal and the second type of sub-control signal, in which the first type of sub-control signal and the second type of sub-control signal may be the same signal or different signals.

The first stage phase shifting circuit 301 is configured to adjust the impedance in response to the first type of sub-control signal to generate a first phase shifting angle signal. The output end of the second stage phase shifting circuit 302 is connected with the adder 303, and the second stage phase shifting circuit 302 is configured to adjust the impedance in response to the second type of sub-control signal to output an orthogonal signal with the corresponding frequency.

The adder is configured to vector-synthesize the orthogonal signal based on the second control signal.

In the embodiments of the disclosure, the phase shifter can adjust the impedance of the orthogonal signal generator based on the frequency of the input radio frequency signal, so that the phase shifter has different impedances when phase-shifting with different frequencies, which allows the orthogonal signal generator to have a larger bandwidth, thereby increasing the bandwidth of the whole phase shifter.

In one possible embodiment, the controller 304 may be at least one of an application specific integrated circuit (ASIC), a digital signal processor (DSP), a digital signal processing device (DSPD), a programmable logic device (PLD), FPGA, a central processing unit (CPU), a controller, a microcontroller and a microprocessor. The controller 304 can generate a first control signal for controlling the differential adder and a second control signal for controlling the amplification circuit corresponding to a preset phase shifting angle. The preset phase shifting angle may be determined according to the application scenario of the phase shifter. For example, in some application scenarios where the phase shifter needs to be shifted by 30 degrees (°), the corresponding preset phase shifting angle is 30°.

It could be understood that both the orthogonal signal generator and the differential adder may include a switching tube. Correspondingly, both the first control signal and the second control signal may be a switching signal for turning on or off the switching tube. For example, both of the first control signal and the second control signal may be a voltage control signal of +12 volts (V) or a voltage control signal of 0V.

In some possible embodiments, when the input signal is a differential signal, the orthogonal signal generated by the orthogonal signal generator may be four orthogonal signals (two positive output ends I+, Q+, and two negative output ends I−, Q−) with the same amplitude and 90−degree phase spacing. The orthogonal signal generator may be any generator capable of generating four orthogonal signals (two positive output ends I+, Q+, and two negative output ends I−, Q−) with the same amplitude and 90-degree phase spacing. For example, the orthogonal signal generator may be a two-order RC filter.

In some possible embodiments, the sum of the second phase shifting angle and the first phase shifting angle is equal to 90 degrees.

It could be understood that the orthogonal signal generator is generally implemented by the phase shifting circuit with at least two stages. Herein, the phase shifting angle of the phase shifting circuit of each stage is less than 90°, and the sum of the phase shifting angles of all stages is 90°. For example, the orthogonal signal generator includes a multistage phase shifting circuit, and the sum of phase shifting angles of all stages in the multistage phase shifting circuit is equal to 90 degrees.

In some possible embodiments, the phase shifting angles of all stages are the same, or the phase shifting angles of all stages are partially the same, or the phase shifting angles of all stages are different from each other.

In one possible embodiment, the first type of sub-control signal can be determined according to the frequency of the input radio frequency signal together with the phase shifting angle of the first stage phase shifting circuit. The first stage phase shifting circuit adjusts its own circuit impedance by controlling the switching tube in the first stage phase shifting circuit to turn on or off, so that the first stage phase shifting circuit phase-shifts the input signal at the same angle under the input radio frequency signals with different frequencies, i.e., generates the first phase shifting angle signal with constant angle. The phase shifting angle of the first stage phase shifting circuit is calculated by the following formula (1):

$$\theta 1=1/(f*R1*C1) \qquad (1);$$

where θ1 represents the phase shifting angle of the first stage phase shifting circuit, f represents the frequency of the input radio frequency signal, and R1*C1 represents the delay constant of the first stage phase shifting circuit; R1 represents the equivalent resistance in the first stage phase shifting circuit connected between the input end and the corresponding output end of the first stage phase shifting circuit; and C1 represents the equivalent capacitance in the first stage phase shifting circuit connected between the input end of the first stage phase shifting circuit and the adjacent output end.

It can be seen from the formula (1) that in case that θ1 is constant, R1*C1 needs to be adjusted according to the change of f.

In one possible embodiment, the second type of sub-control signal can be determined according to the frequency of the input radio frequency signal together with the phase shifting angle of the second stage phase shifting circuit. The second stage phase shifting circuit adjusts its own circuit impedance by controlling the switching tube of the second stage phase shifting circuit to turn on or off, so that the second stage phase shifting circuit phase-shifts the input signal phase-shifted by the first phase shifting circuit at the same angle under the input radio frequency signals with different frequencies, i.e., generates the orthogonal signal with constant angle.

The phase shifting angle of the second stage phase shifting circuit is calculated by the following formula (2):

$$\theta 2=1/(f*R2*C2) \qquad (2);$$

where θ2 represents the phase shifting angle of the second stage phase shifting circuit, f represents the frequency of the input radio frequency signal, and R2*C2 represents the delay constant of the second stage phase shifting circuit; R2 represents the equivalent resistance in the second stage phase shifting circuit connected between the input end and the corresponding output end of the second stage phase shifting circuit; and C2 represents the equivalent capacitance in the second stage phase shifting circuit connected between the input end of the second stage phase shifting circuit and the adjacent output end.

It can be seen from the formula (2) that in case that θ2 is constant, R2*C2 needs to be adjusted according to the change of f.

In one possible embodiment, the second phase shifting circuit after impedance adjustment can be used to phase-shift the input first phase shifting angle by the second phase shifting angle to output the orthogonal signal with corresponding frequency. The sum of the second phase shifting angle and the first phase shifting angle is equal to 90 degrees.

In the embodiments of the disclosure, the first stage phase shifting circuit in the orthogonal signal generator adjusts its own circuit impedance in response to the first type of sub-control signal to generate the first phase shifting angle signal. The second stage phase shifting circuit adjusts its own circuit impedance in response to the second type of sub-control signal to output the orthogonal signal with corresponding frequency. In this way, the two-stage phase shifting circuit adjusts the impedance under different frequencies to increase the bandwidth of the phase shifter.

In some possible embodiments, the first stage phase shifting circuit includes a first resistor sub-circuit and a first capacitor sub-circuit; and/or the second stage phase shifting circuit includes a second resistor sub-circuit and a second capacitor sub-circuit. The first stage phase shifting circuit is configured to adjust the equivalent capacitance of the first capacitor sub-circuit and/or the equivalent resistance of the first resistor sub-circuit based on the frequency of the input signal. The second stage phase shifting circuit is configured to adjust the equivalent capacitance of the second capacitor sub-circuit and/or the equivalent resistance of the second resistor sub-circuit based on the frequency of the input signal.

Figure 4:
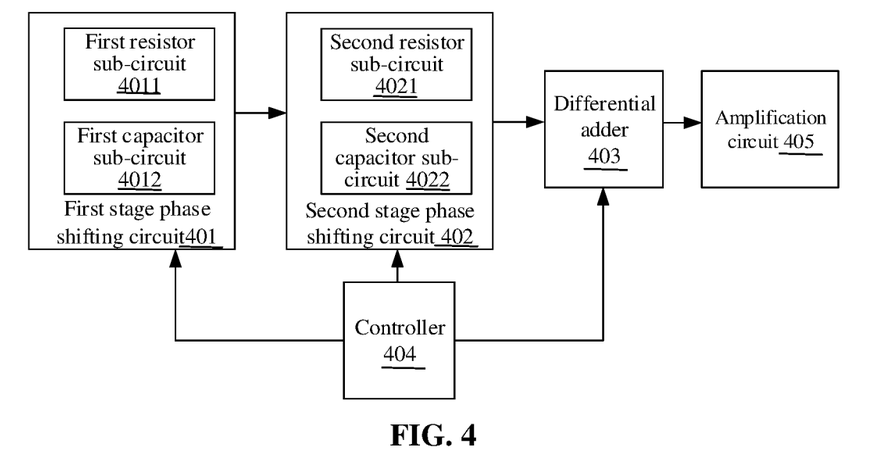
FIG. 4 is a schematic diagram of the component structure of another phase shifter provided by the embodiments of the disclosure.

FIG. 4 is a schematic diagram of the component structure of another phase shifter provided by the embodiments of the disclosure. As shown in FIG. 4, the difference from the above embodiments is in that the first stage phase shifting circuit 401 includes a first resistor sub-circuit 4011 and a first capacitor sub-circuit 4012; and the second stage phase shifting circuit 402 includes a second resistor sub-circuit 4021 and a second capacitor sub-circuit 4022.

In some possible embodiments, the first stage phase shifting circuit is configured to generate the first phase shifting angle signal based on a first delay constant which is a product of the equivalent capacitance of the first capacitor sub-circuit and the equivalent resistance of the first resistor sub-circuit; and/or, the second stage phase shifting circuit is configured to generate the orthogonal signal with corresponding frequency based on a second delay constant which is a product of the equivalent capacitance of the second capacitor sub-circuit and the equivalent resistance of the second resistor sub-circuit.

In one embodiment, the controller 404 is configured to generate the first type of sub-control signal used for controlling the product of the equivalent capacitance of the first capacitor sub-circuit 4012 and the equivalent resistance of the first resistor sub-circuit 4011 and the second type of sub-control signal used for controlling the product of the equivalent capacitance of the second capacitor sub-circuit 4022 and the equivalent resistance of the second resistor sub-circuit 4021 based on the frequency of the input radio frequency signal.

The first stage phase shifting circuit 401 is configured to determine the product of the equivalent capacitance of the first capacitor sub-circuit 4012 and the equivalent resistance of the first resistor sub-circuit 4011 as the first delay constant in response to the first type of sub-control signal, to generate the differential signal with the first phase shifting angle.

The second stage phase shifting circuit 402 is configured to determine the product of the equivalent capacitance of the second capacitor sub-circuit 4022 and the equivalent resistance of the second resistor sub-circuit 4021 as the second delay constant in response to the second type of sub-control signal, to output the orthogonal signal with corresponding frequency.

Here, the first resistor sub-circuit represented includes a first resistor and other circuits for impedance adjustment; the first capacitor sub-circuit represented includes a first capacitor and other circuits for capacitance adjustment; the second resistor sub-circuit represented includes a second resistor and other circuits for impedance adjustment; and the second capacitor sub-circuit represented includes a second capacitor and other circuits for capacitance adjustment.

It could be understood that the equivalent resistance of the first resistor sub-circuit and the equivalent capacitance of the first capacitor sub-circuit may be R1 and C1 in formula (1), respectively; and the equivalent resistance of the second resistor sub-circuit and the equivalent capacitance of the second capacitor sub-circuit may be R2 and C2 in formula (2), respectively.

In some possible embodiments, the product of the equivalent capacitance of the first capacitor sub-circuit 4012 and the equivalent resistance of the first resistor sub-circuit 4011 is the delay constant R1*C1 of the first stage phase shifting circuit in formula (1); and the product of the equivalent capacitance of the second capacitor sub-circuit 4022 and the equivalent resistance of the second resistor sub-circuit 4021 may be the delay constant R2*C2 of the second stage phase shifting circuit in formula (2).

It could be understood that the product of the equivalent capacitance of the first capacitor sub-circuit 4012 and the equivalent resistance of the first resistor sub-circuit 4011 is inversely proportional to the phase shifting angle of the first stage phase shifting circuit in the case that the phase shifting angle of the first stage phase shifting circuit is constant. The product of the equivalent capacitance of the second capacitor sub-circuit 4022 and the equivalent resistance of the second resistor sub-circuit 4021 is inversely proportional to the phase shifting angle of the second stage phase shifting circuit in the case that the phase shifting angle of the second stage phase shifting circuit is constant.

It could be understood that in formula (1), the first delay constant represents the product of R1 and C1 corresponded to the frequency of the input radio frequency signal in the case that the phase shifting angle of the first stage phase shifting circuit is constant. In formula (2), the second delay constant represents the product of R2 and C2 corresponded to the frequency of the input radio frequency signal in the case that the phase shifting angle of the second stage phase shifting circuit is constant.

In the embodiments of the disclosure, the product of the equivalent capacitance of the first capacitor sub-circuit and the equivalent resistance of the first resistor sub-circuit in the first stage phase shifting circuit is adjusted to the first delay constant based on the first type of sub-control signal generated according to the frequency of the input radio frequency signal, and the product of the equivalent capacitance of the second capacitor sub-circuit and the equivalent resistance of the second resistor sub-circuit in the second stage phase shifting circuit is adjusted to the second delay constant based on the second type of sub-control signal generated according to the frequency of the input radio frequency signal, so that generates the orthogonal signal generated by the orthogonal signal generator has the corresponding frequency, meeting the bandwidth requirement.

In one possible embodiment, the first stage phase shifting circuit is configured to adjust the equivalent capacitance of the first capacitor sub-circuit and/or the equivalent resistance of the first resistor sub-circuit in response to the first type of sub-control signal, so that the product of the equivalent capacitance of the first capacitor sub-circuit and the equivalent resistance of the first resistor sub-circuit is the first delay constant and the first phase shifting angle signal is generated.

The second stage phase shifting circuit is configured to adjust the equivalent capacitance of the second capacitor sub-circuit and/or the equivalent resistance of the second resistor sub-circuit in response to the second type of sub-control signal, so that the product of the equivalent capacitance of the second capacitor sub-circuit and the equivalent resistance of the second resistor sub-circuit is the second delay constant and the orthogonal signal with the corresponding frequency is output.

In some possible embodiments, the first resistor sub-circuit and/or the first capacitor sub-circuit includes a first impedance adjusting circuit having a plurality of first switches, and performing impedance adjustment through the first switches; and/or, the second resistor sub-circuit and/or the second capacitor sub-circuit includes a second impedance adjusting circuit having a plurality of second switches and performing impedance adjustment through the second switches.

Figure 5:
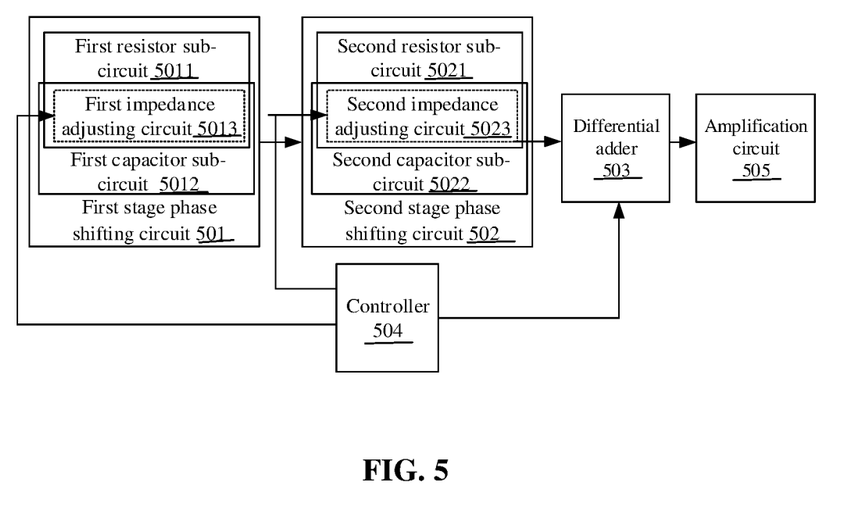
FIG. 5 is a schematic diagram of the component structure of yet another phase shifter provided by the embodiments of the disclosure.

FIG. 5 is a schematic diagram of the component structure of yet another phase shifter provided by the embodiments of the disclosure. As shown in FIG. 5, the difference from the above embodiments is in that the first resistor sub-circuit 5011 or the first capacitor sub-circuit 5012 includes the first impedance adjusting circuit 5013; and the second resistor sub-circuit 5021 or the second capacitor sub-circuit 5022 includes the second impedance adjusting circuit 5023.

The first impedance adjusting circuit 5013 has a plurality of first switches through which the first impedance adjusting circuit performs impedance adjustment. The second impedance adjusting circuit 5023 has a plurality of second switches through which the second impedance adjusting circuit performs impedance adjustment.

The output end of the first stage phase shifting circuit 501 is connected with the second input end of the second stage phase shifting circuit 502. The first stage phase shifting circuit 501 is configured to turn on or off the first switches of the first impedance adjusting circuit 5013 in response to the first type of sub-control signal, to change the equivalent capacitance of the first capacitor sub-circuit 5012 and/or the equivalent resistance of the first resistor sub-circuit 5011, so that the product of the equivalent capacitance of the first capacitor sub-circuit 5012 and the equivalent resistance of the first resistor sub-circuit 5011 is the first delay constant and the first phase shifting angle signal is generated.

The output end of the second stage phase shifting circuit 502 is connected with the differential adder 503. The second stage phase shifting circuit is configured to turn on or off the second switches of the second impedance adjustment circuit 5023 in response to the second type of sub-control signal to change the equivalent capacitance of the second capacitor sub-circuit 5022 and/or the equivalent resistance of the second resistor sub-circuit 5021, so that the product of the equivalent capacitance of the second capacitor sub-circuit 5022 and the equivalent resistance of the second resistor sub-circuit 5021 is the second delay constant and the orthogonal signal with the corresponding frequency is output. Herein, both the first delay constant and the second delay constant are determined according to the frequency of the input radio frequency signal.

It could be understood that both the first impedance adjusting circuit 5013 and the second impedance adjusting circuit 5023 may include an adjusting resistor or an adjusting capacitor. In one embodiment, the first impedance adjusting circuit 5013 and the second impedance adjusting circuit 5023 may be circuits including adjusting resistors connected in parallel with the first resistor in the first resistor sub-circuit 5011 and the second resistor in the second resistor sub-circuit 5021, respectively. For example, the first impedance adjusting circuit 5013 and the second impedance adjusting circuit 5023 may each be a parallel circuit formed by at least two adjusting resistors in parallel, or a single adjusting resistor connected in parallel with the first resistor or the second resistor. In another embodiment, the first impedance adjusting circuit 5013 and the second impedance adjusting circuit 5023 may be circuits including adjusting capacitors connected in parallel with the first capacitor in the first capacitor sub-circuit 5012 and the second capacitor in the second capacitor sub-circuit 5022, respectively. For example, the first impedance adjusting circuit 5013 and the second impedance adjusting circuit 5023 may each be a parallel circuit formed by at least two adjusting capacitors in parallel, or a single adjusting capacitor connected in parallel with the first capacitor or the second capacitor.

In one embodiment, both the first impedance adjusting circuit 5013 and the second impedance adjusting circuit 5023 may include a switching tube connected in series with the adjusting resistor or the adjusting capacitor.

Here, the switching tube represents a semiconductor device that can be used as a switch. For example, the switching tube may be a triode or a metal-oxide-semiconductor field-effect transistor (MOSET).

In the embodiments of the disclosure, the first impedance adjusting circuit is turned on or off by the first stage phase shifting circuit in response to the first type of sub-control signal to change the equivalent capacitance of the first capacitor sub-circuit or the equivalent resistance of the first resistor sub-circuit, so that the product of the equivalent capacitance of the first capacitor sub-circuit and the equivalent resistance of the first resistor sub-circuit is the first delay constant and the first phase shifting angle signal is generated. The second impedance adjusting circuit is turned on or off by the second stage phase shifting circuit in response to the second type of sub-control signal to change the equivalent capacitance of the second capacitor sub-circuit or the equivalent resistance of the second resistor sub-circuit, so that the product of the equivalent capacitance of the second capacitor sub-circuit and the equivalent resistance of the second resistor sub-circuit is the second delay constant and the orthogonal signal with the corresponding frequency is output. Therefore, the phase shifting angles of the first stage phase shifting circuit and the second stage phase shifting circuit in the orthogonal signal generator are constant under different frequencies, and thus the working bandwidth of the orthogonal signal generator can be broadened.

Figure 6:
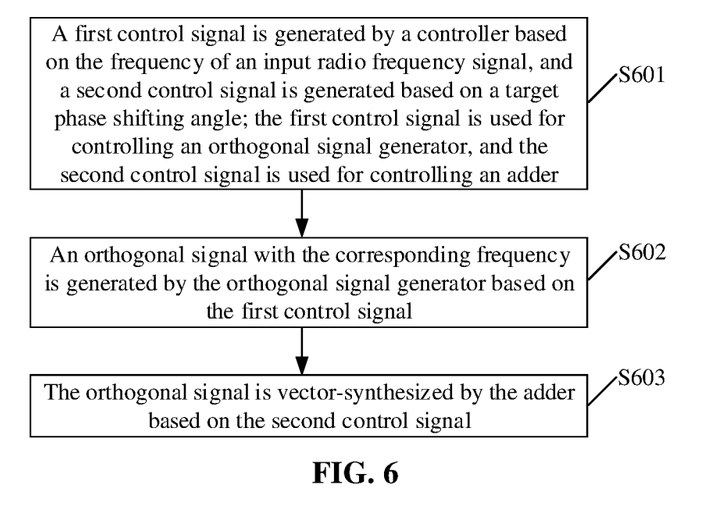
FIG. 6 is an implementation flowchart of a phase shifting method provided by the embodiments of the disclosure.

On the basis of the above embodiments, the embodiments of the disclosure further provide a phase shifting method that can be applied to a multiphase phase shifter. As shown in FIG. 6, the method includes the following operations.

In S601, a first control signal is generated by a controller based on the frequency of an input radio frequency signal, and a second control signal is generated based on a target phase shifting angle; the first control signal is used for controlling an orthogonal signal generator, and the second control signal is used for controlling an adder.

In S602, an orthogonal signal with the corresponding frequency is generated by the orthogonal signal generator based on the first control signal.

In S603, the orthogonal signal is vector-synthesized by the adder based on the second control signal.

Figure 7:
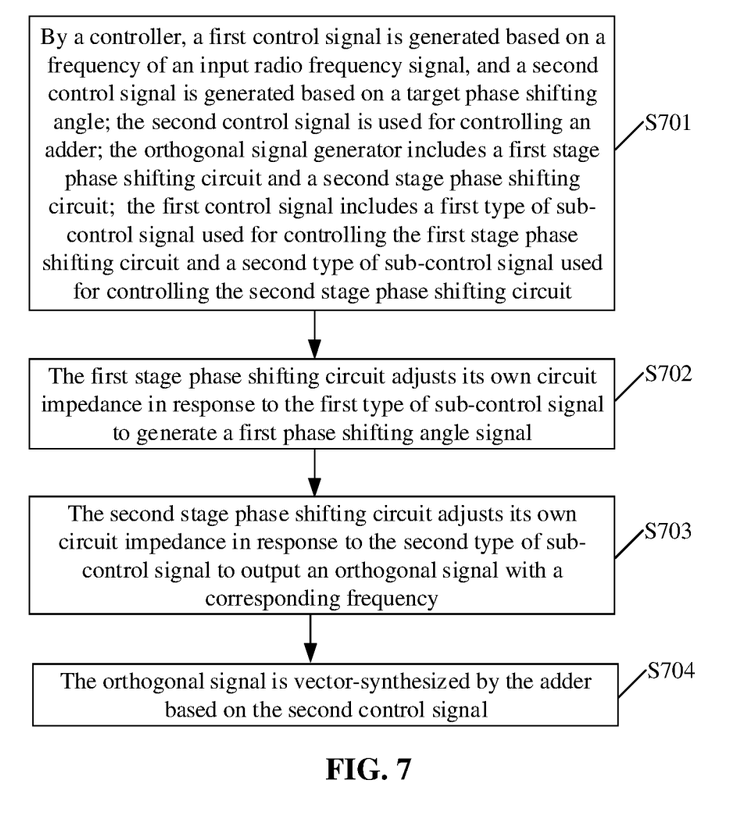
FIG. 7 is an implementation flowchart of another phase shifting method provided by the embodiments of the disclosure.

FIG. 7 is an implementation flowchart of another phase shifting method provided by the embodiments of the disclosure. As shown in FIG. 7, the method includes the following operations.

In S701, by a controller, a first control signal is generated based on a frequency of an input radio frequency signal, and a second control signal is generated based on a target phase shifting angle; the second control signal is used for controlling an adder; the orthogonal signal generator includes a first stage phase shifting circuit and a second stage phase shifting circuit; the first control signal includes a first type of sub-control signal used for controlling the first stage phase shifting circuit and a second type of sub-control signal used for controlling the second stage phase shifting circuit.

In S702, the first stage phase shifting circuit adjusts its own circuit impedance in response to the first type of sub-control signal to generate a first phase shifting angle signal.

In S703, the second stage phase shifting circuit adjusts its own circuit impedance in response to the second type of sub-control signal to output the orthogonal signal with a corresponding frequency.

In S704, the orthogonal signal is vector-synthesized by the adder based on the second control signal.

Figure 8:
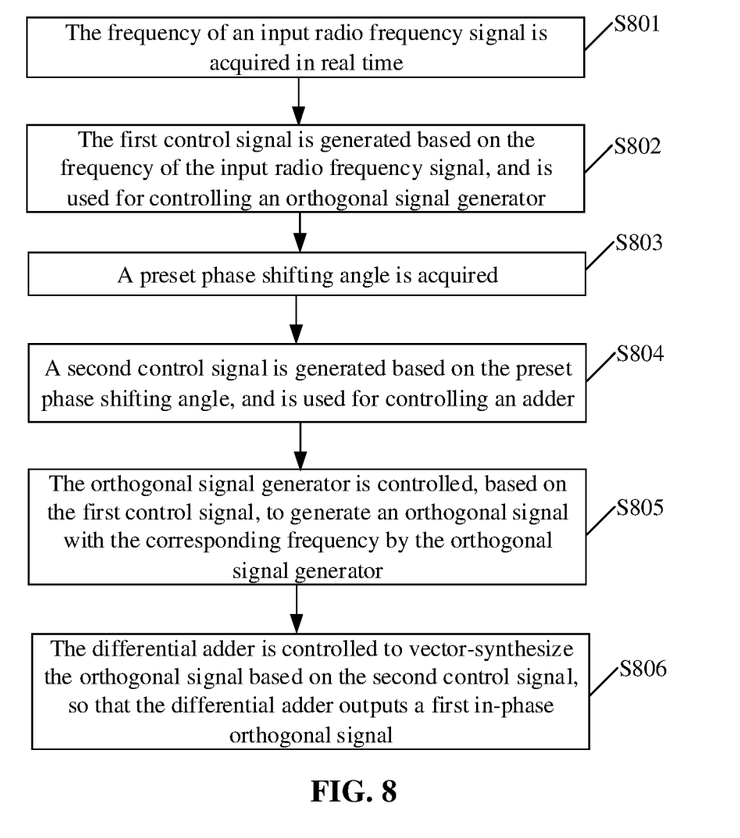
FIG. 8 is an implementation flowchart of yet another phase shifting method provided by the embodiments of the disclosure.

FIG. 8 is an implementation flowchart of yet another phase shifting method provided by embodiments of the disclosure. As shown in FIG. 8, the method includes the following operations.

In S801, the frequency of an input radio frequency signal is acquired in real time.

In S802, a first control signal is generated based on the frequency of the input radio frequency signal, and is used for controlling an orthogonal signal generator.

In S803, a preset phase shifting angle is acquired.

In S804, a second control signal is generated based on the preset phase shifting angle, and is used for controlling an adder.

In S805, the orthogonal signal generator is controlled, based on the first control signal, to generate an orthogonal signal with the corresponding frequency by the orthogonal signal generator.

In S806, the differential adder is controlled to vector-synthesize the orthogonal signal based on the second control signal, so that the differential adder outputs a first in-phase orthogonal signal.

Figure 9:
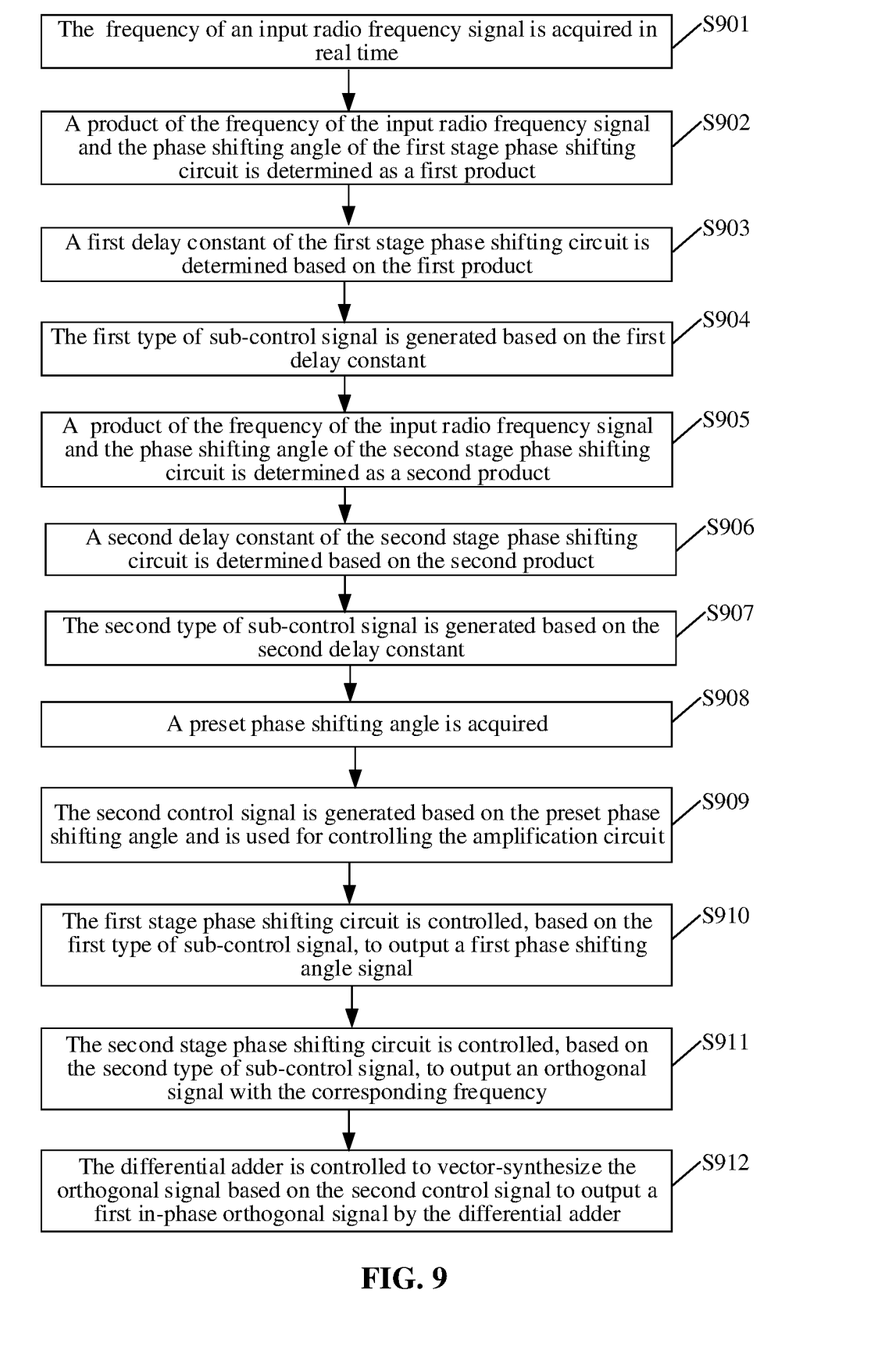
FIG. 9 is an implementation flowchart of yet another phase shifting method provided by the embodiments of the disclosure.

FIG. 9 is an implementation flowchart of yet another multiphase phase shifting method provided by the embodiments of the disclosure. As shown in FIG. 9, the method can be applied for a controller in the multiphase phase shifter, and includes the following operations.

In S901, the frequency of an input radio frequency signal is acquired in real time.

In S902, a product of the frequency of the input radio frequency signal and the phase shifting angle of the first stage phase shifting circuit is determined as a first product.

Understandably, it can be known according to formula (1) that:

$$\theta1*f=1/R1*C1 \quad (3);$$

It can be seen from formula (3) that in order to keep θ1 constant when f changes, the product of θ1 and f can be obtained first, and then the product of R1 and C1 is determined according to the product of θ1 and f, and the first type of sub-control signal is generated correspondingly.

In S903, a first delay constant of the first stage phase shifting circuit is determined based on the first product.

In S904, the first type of sub-control signal is generated based on the first delay constant.

In S905, a product of the frequency of the input radio frequency signal and the phase shifting angle of the second stage phase shifting circuit is determined as a second product.

Understandably, it can be known according to formula (4) that:

$$\theta2*f=1/R2*C2 \quad (4);$$

It can be seen from formula (4) that in order to keep θ2 constant when f changes, the product of θ2 and f can be obtained first, and then the product of R2 and C2 is determined according to the product of θ2 and f, and the first type of sub-control signal can be generated correspondingly.

In S906, a second delay constant of the second stage phase shifting circuit is determined based on the second product.

In S907, the second type of sub-control signal is generated based on the second delay constant.

In S908, a preset phase shifting angle is acquired.

In S909, the second control signal is generated based on the preset phase shifting angle and is used for controlling the amplification circuit.

In S910, the first stage phase shifting circuit is controlled, based on the first type of sub-control signal, to output a first phase shifting angle signal.

In S911, the second stage phase shifting circuit is controlled, based on the second type of sub-control signal, to output an orthogonal signal with the corresponding frequency.

In S912, the differential adder is controlled to vector-synthesize the orthogonal signal based on the second control signal, so that the differential adder outputs a first in-phase orthogonal signal.

Figure 10:
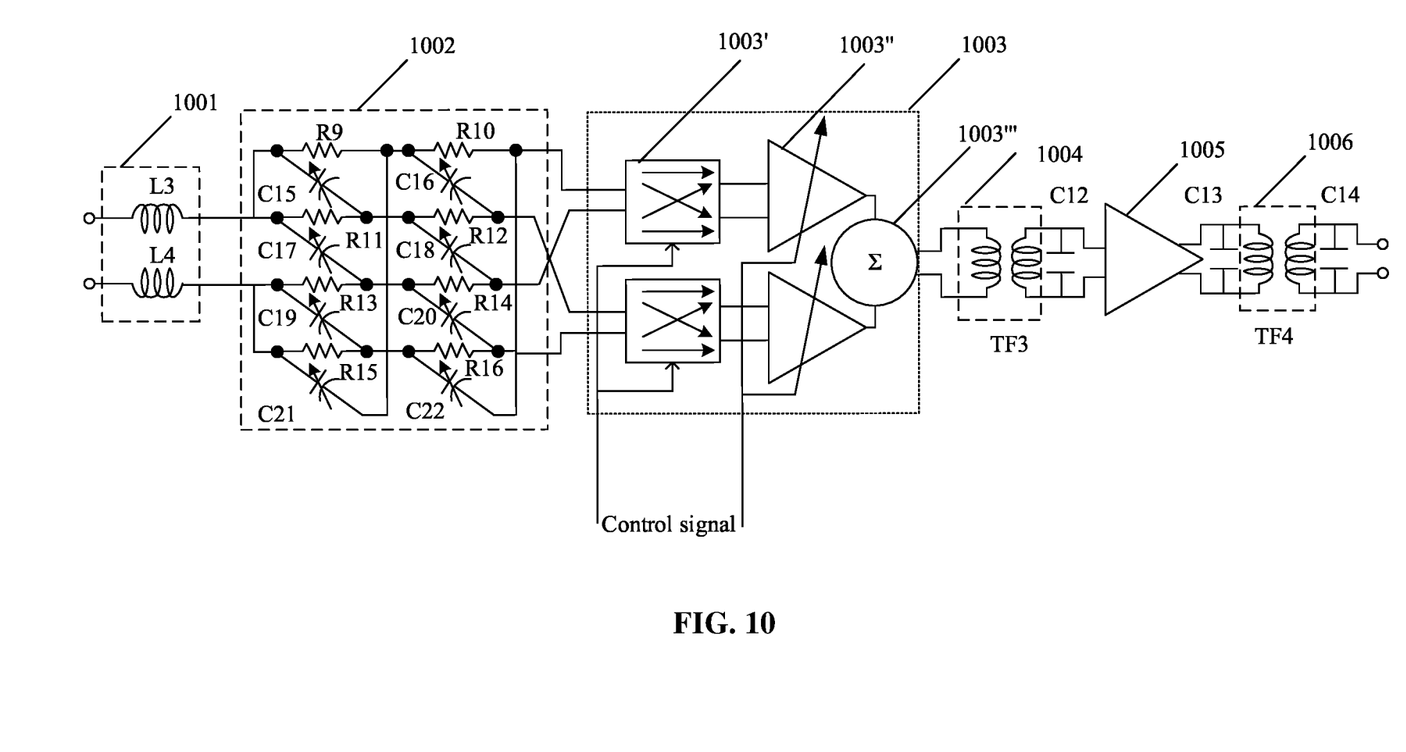
FIG. 10 is a component circuit diagram of an active phase shifter provided by the embodiments of the disclosure.

FIG. 10 is a component circuit diagram of an active phase shifter provided by the embodiments of the disclosure. As shown in FIG. 10, the active filter includes the inter stage matching network 1001, the PPF 1002, the analog adder 1003, the transformer TF3 1004, the twelfth capacitor C12, the differential amplification circuit 1005, the thirteenth capacitor C13, the transformer TF4 1006, and the fourteenth capacitor C20 that are connected in sequence. A differential radio frequency signal with constant amplitude is input to the input end of the IMN 1001, and is network-matched by the IMN 1001. The network-matched differential radio frequency signal with constant amplitude is input to the PPF 1002, and generates four orthogonal signals (two positive output ends I+, Q+ and two negative output ends I−, Q−) with the same amplitude and 90-degree phase spacing by the PPF 1002. The four orthogonal signals with the same amplitude and 90-degree phase spacing are input to the analog adder 1003, and vector-synthesized by the analog adder 1003 in response to an external control signal, to output the first in-phase orthogonal signal with constant phase shift to the TF3 1004. The first in-phase orthogonal signal is isolated by the TF3 1004 to output the isolated first in-phase orthogonal signal to the differential amplification circuit 1005. The power thereof is then amplified by the differential amplification circuit 1005 to output the isolated and power-amplified first in-phase orthogonal signal. The isolated and power-amplified first in-phase orthogonal signal is then isolated by The TF4 1106 to output a second in-phase orthogonal signal.

At the same time, C12 is connected cross the two input ends of the differential amplification circuit 1005, and is used for removing electromagnetic interference. C13 and C14 are connected cross the two input ends and two output ends of the TF4 1006, respectively, and are used for removing electromagnetic interference generated by TF4 1006.

Here, the IMN 1101 includes a third inductor L3 and a fourth inductor L4. L3 and L4 are connected in series at the first input end and the second input end of the PPF 1002, respectively. The PPF 1002 is a two-order RC filter. The analog adder 1003 includes an orthogonal path selecting unit 1003', a variable gain amplifier 1003" and an adder 1003''' that are connected in sequence.

It could be understood that the two-order RC filter includes eight resistors R9 to R16 and eight capacitors with variable capacitance C15 to C22. Herein, a series branch formed by connecting R9 and R10 in series is connected between the first input end and the first output end (I+) of the two-order RC filter; a series branch formed by connecting R11 and R12 in series is connected between the first input end and the second output end (Q+) of the two-order RC filter; a series branch formed by connecting R13 and R14 in series is connected between the second input end and the third output end (I−) of the two-order RC filter; a series branch formed by connecting R15 and R16 in series is connected between the second input end and the fourth output end (Q−) of the two-order RC filter; C15 is connected across both ends of R11, and the positive electrode of C15 is connected to the first input end; the negative electrode of C16 is connected to the second output end, and the positive electrode of C16 is connected to the common node of R9 and R10; the positive electrode of C17 is connected to the first input end, and the negative electrode of C17 is connected to the common node of R13 and R14; the negative electrode of C18 is connected to the third output end, and the positive electrode of C18 is connected to the common node of R11 and R12; C19 is connected across both ends of R15, and the positive electrode of C19 is connected to the second input end; the negative electrode of C20 is connected to the fourth output end, and the positive electrode of C20 is connected to the common node of R14 and R14; the positive electrode of C21 is connected to the second input end, and the negative electrode of C21 is connected to the common node of R9 and R10; the negative electrode of C22 is connected to the first output end, and the positive electrode of C22 is connected to the common node of R15 and R16.

The above description of various embodiments tends to emphasize the differences among them, the same or similarities thereof can be referred to each other, which are not be repeated herein for the sake of brevity.

The methods disclosed in various method embodiments provided by the disclosure may be combined arbitrarily without conflict to obtain new method embodiments.

The features disclosed in various product embodiments provided by the disclosure may be combined arbitrarily without conflict to obtain new product embodiments.

The features disclosed in various method or phase shifters provided by the disclosure may be combined arbitrarily without conflict to obtain new method or equipment embodiments.

The embodiments of the disclosure are described above in combination with the drawings. However, the disclosure is not limited to the above embodiments. The above embodiments are merely illustrative and not restrictive. Many variants can be made by those skilled in the art under the teachings provided by this disclosure without departing from the spirit of this disclosure and protection scope of the claims, all of which fall within the protection of this application.

The invention claimed is:

1. An orthogonal signal generator, comprising: a first stage phase shifting circuit and a second stage phase shifting circuit;
   an output end of the first stage phase shifting circuit being connected with an input end of the second stage phase shifting circuit, an impedance of the first stage phase shifting circuit being adjustable based on a frequency of a first input signal, and the first stage phase shifting circuit being configured to phase-shift the first input signal by a first phase shifting angle and generate a first phase shifting angle signal;
   an impedance of the second stage phase shifting circuit being adjustable based on a frequency of a second input signal, the second stage phase shifting circuit being configured to phase-shift the phase-shifted second input signal by a second phase shifting angle and output an orthogonal signal with a corresponding frequency;
   wherein the first stage phase shifting circuit comprises a first resistor sub-circuit and a first capacitor sub-circuit; and/or the second stage phase shifting circuit comprises a second resistor sub-circuit and a second capacitor sub-circuit;
   the first stage phase shifting circuit is configured to adjust an equivalent capacitance of the first capacitor sub-circuit and/or an equivalent resistance of the first resistor sub-circuit based on the frequency of the first input signal;
   the second stage phase shifting circuit is configured to adjust an equivalent capacitance of the second capacitor sub-circuit and/or an equivalent resistance of the second resistor sub-circuit based on the frequency of the second input signal;
   wherein the first resistor sub-circuit and/or the first capacitor sub-circuit comprises a first impedance adjusting circuit having a plurality of first switches and performing impedance adjustment through the first switches;
   and/or, the second resistor sub-circuit and/or the second capacitor sub-circuit comprises a second impedance adjusting circuit having a plurality of second switches and performing impedance adjustment through the second switches.

2. The orthogonal signal generator according to claim 1, wherein a sum of the second phase shifting angle and the first phase shifting angle is equal to 90 degrees.

3. The orthogonal signal generator according to claim 1, wherein the orthogonal signal generator comprises a multi-stage phase shifting circuit, and a sum of phase shifting angles of all stages of the multi-stage phase shifting circuit is equal to 90 degrees.

4. The orthogonal signal generator according to claim 3, wherein the phase shifting angles of all stages are same, or the phase shifting angles of all stage are partially same, or the phase shifting angles of all stages are different from each other.

5. The orthogonal signal generator according to claim 1, wherein a signal input to the orthogonal signal generator is a differential signal.

6. An orthogonal signal generator, comprising: a first stage phase shifting circuit and a second stage phase shifting circuit;
   an output end of the first stage phase shifting circuit being connected with an input end of the second stage phase shifting circuit, an impedance of the first stage phase shifting circuit being adjustable based on a frequency of a first input signal, and the first stage phase shifting circuit being configured to phase-shift the first input signal by a first phase shifting angle and generate a first phase shifting angle signal;
   an impedance of the second stage phase shifting circuit being adjustable based on a frequency of a second input signal, the second stage phase shifting circuit being configured to phase-shift the phase-shifted second input signal by a second phase shifting angle and output an orthogonal signal with a corresponding frequency;
   wherein the first stage phase shifting circuit comprises a first resistor sub-circuit and a first capacitor sub-circuit; and/or the second stage phase shifting circuit comprises a second resistor sub-circuit and a second capacitor sub-circuit;
   the first stage phase shifting circuit is configured to adjust an equivalent capacitance of the first capacitor sub-circuit and/or an equivalent resistance of the first resistor sub-circuit based on the frequency of the first input signal;
   the second stage phase shifting circuit is configured to adjust an equivalent capacitance of the second capacitor sub-circuit and/or an equivalent resistance of the second resistor sub-circuit based on the frequency of the second input signal;
   wherein the first stage phase shifting circuit is configured to generate the first phase shifting angle signal based on a first delay constant which is a product of the equivalent capacitance of the first capacitor sub-circuit and the equivalent resistance of the first resistor sub-circuit;
   and/or the second stage phase shifting circuit is configured to generate the orthogonal signal with a corresponding frequency based on a second delay constant which is a product of the equivalent capacitance of the second capacitor sub-circuit and the equivalent resistance of the second resistor sub-circuit.

7. A phase shifter, comprising: an adder, a controller, and an orthogonal signal generator comprising:

a first stage phase shifting circuit and a second stage phase shifting circuit;
an output end of the first stage phase shifting circuit being connected with an input end of the second stage phase shifting circuit, an impedance of the first stage phase shifting circuit being adjustable based on a frequency of a first input signal, and the first stage phase shifting circuit being configured to phase-shift the first input signal by a first phase shifting angle and generate a first phase shifting angle signal;
an impedance of the second stage phase shifting circuit being adjustable based on a frequency of a second input signal, the second stage phase shifting circuit being configured to phase-shift the phase-shifted second input signal by a second phase shifting angle and output an orthogonal signal with a corresponding frequency;
an output end of the controller being respectively connected with an input end of the orthogonal signal generator and a first input end of the adder; and the controller being configured to generate a first control signal based on a frequency of an input radio frequency signal and to generate a second control signal based on a target phase shifting angle; the first control signal being used for controlling the orthogonal signal generator, and the second control signal being used for controlling the adder; and
an output end of the orthogonal signal generator being connected with a second input end of the adder, and the orthogonal signal generator being configured to generate an orthogonal signal with a corresponding frequency based on the first control signal.

8. An amplifying device comprising an amplification circuit and the phase shifter according to claim 7 comprising the adder, the controller, and the orthogonal signal generator;
wherein an output end of the phase shifter is connected with an input end of the amplification circuit.

9. A method for phase shifting, applied to the phase shifter according to claim 7, comprising
acquiring the frequency of the input radio frequency signal in real time;
generating the first control signal based on the frequency of the input radio frequency signal, wherein the first control signal is used for controlling the orthogonal signal generator;
acquired a preset phase shifting angle;
generating the second control signal based on the preset phase shifting angle, wherein the second control signal is used for controlling the adder;
controlling the orthogonal signal generator based on the first control signal to generate the orthogonal signal with the corresponding frequency;
controlling the adder to vector-synthesize the orthogonal signal based on the second control signal to output a first in-phase orthogonal signal.

10. The method according to claim 9, wherein the orthogonal signal generator comprises the first stage phase shifting circuit and the second stage phase shifting circuit;
the first control signal comprises a first input signal used for controlling the first stage phase shifting circuit and a second type of sub-control signal used for controlling the second stage phase shifting circuit; wherein the generating the first control signal based on the frequency of the input radio frequency signal comprises:
determining a product of the frequency of the input radio frequency signal and the phase shifting angle of the first stage phase shifting circuit as a first product;
determining a first delay constant of the first stage phase shifting circuit based on the first product;
generating the first input signal based on the first delay constant;
determining a product of the frequency of the input radio frequency signal and the phase shifting angle of the second stage phase shifting circuit as a second product;
determining a second delay constant of the second stage phase shifting circuit based on the second product;
generating the second type of sub-control signal based on the second delay constant;
correspondingly, wherein the controlling the orthogonal signal generator based on the first control signal to generate the orthogonal signal with the corresponding frequency comprises:
controlling the first stage phase shifting circuit based on the first input signal to output the first phase shifting angle signal;
controlling the second stage phase shifting circuit based on the second type of sub-control signal to output the orthogonal signal with the corresponding frequency.

11. A method for generating an orthogonal signal, applied to an orthogonal signal generator comprising:
a first stage phase shifting circuit and a second stage phase shifting circuit;
an output end of the first stage phase shifting circuit being connected with an input end of the second stage phase shifting circuit, an impedance of the first stage phase shifting circuit being adjustable based on a frequency of a first input signal, and the first stage phase shifting circuit being configured to phase-shift the first input signal by a first phase shifting angle and generate a first phase shifting angle signal;
an impedance of the second stage phase shifting circuit being adjustable based on a frequency of a second input signal, the second stage phase shifting circuit being configured to phase-shift the phase-shifted second input signal by a second phase shifting angle and output an orthogonal signal with a corresponding frequency;
the method comprising
adjusting a circuit impedance of the first stage phase shifting circuit by the first stage phase shifting circuit based on the frequency of the first input signal, and phase-shifting the first input signal by the first phase shifting angle to output the first phase shifting angle signal;
adjusting a circuit impedance of the second stage phase shifting circuit by the second stage phase shifting circuit based on the frequency of the second input signal, and phase-shifting the phase-shifted second input signal by the second phase shifting angle to output the orthogonal signal with the corresponding frequency.

* * * * *